United States Patent
Herfurth et al.

(10) Patent No.: US 6,995,467 B2
(45) Date of Patent: Feb. 7, 2006

(54) SEMICONDUCTOR COMPONENT

(75) Inventors: Michael Herfurth, Gilching (DE); Roland Rupp, Lauf (DE); Ilia Zverev, München (DE)

(73) Assignee: Infineon Technologies AG, Munich (DE)

( * ) Notice: Subject to any disclaimer, the term of this patent is extended or adjusted under 35 U.S.C. 154(b) by 222 days.

(21) Appl. No.: 10/291,062

(22) Filed: Nov. 8, 2002

(65) Prior Publication Data

US 2003/0089980 A1 May 15, 2003

Related U.S. Application Data

(63) Continuation of application No. PCT/EP01/05216, filed on May 8, 2001.

(30) Foreign Application Priority Data

May 8, 2000 (DE) .......................................... 100 22 268

(51) Int. Cl.
*H01L 23/34* (2006.01)

(52) U.S. Cl. .................. 257/724; 257/625; 257/106
(58) Field of Classification Search ................. 257/625, 257/E29.338, 106, 724
See application file for complete search history.

(56) References Cited

U.S. PATENT DOCUMENTS

| | | | |
|---|---|---|---|
| 4,604,643 A | * | 8/1986 | Yotsumoto et al. ......... 257/732 |
| 4,768,075 A | | 8/1988 | Broich et al. |
| 5,689,144 A | * | 11/1997 | Williams .................... 307/130 |
| 5,789,311 A | * | 8/1998 | Ueno et al. .................. 438/573 |
| 5,801,570 A | * | 9/1998 | Mizuno et al. ............. 327/362 |
| 5,814,885 A | | 9/1998 | Pogge et al. |
| 6,013,950 A | * | 1/2000 | Nasby ......................... 257/734 |
| 6,137,170 A | | 10/2000 | Ujiie et al. |
| 6,144,093 A | * | 11/2000 | Davis et al. ................. 257/723 |
| 6,404,050 B2 | * | 6/2002 | Davis et al. ................. 257/724 |
| 6,504,230 B2 | | 1/2003 | Deboy et al. |

FOREIGN PATENT DOCUMENTS

| | | |
|---|---|---|
| DE | 297 24 081 U1 | 2/2000 |
| DE | 199 64 214 A1 | 4/2001 |
| EP | 0 222 203 A1 | 5/1987 |
| EP | 0 492 558 A2 | 7/1992 |

OTHER PUBLICATIONS

Joe Martinez et al.: "Modular Power Substrate Design Concept For Multiple High Power Module Applications", Motorola Technical Developments, vol. 27, May 1, 1996, pp. 39–41, XP–000594542.

* cited by examiner

*Primary Examiner*—Amir Zarabian
*Assistant Examiner*—Thanh Y. Tran
(74) *Attorney, Agent, or Firm*—Laurence A. Greenberg; Werner H. Stemer; Ralph E. Locher

(57) ABSTRACT

A semiconductor component contains two semiconductor bodies, which are spatially separated from one another and electrically interconnected. A compensation MOS field effect transistor is provided as the first semiconductor body, and a silicon carbide Schottky diode is provided as the second semiconductor body. Consequently, the semiconductor component can advantageously be produced significantly more compactly and more cost-effectively, since both the compensation MOS field-effect transistor and the silicon carbide Schottky diode contribute to a significant reduction of power loss.

13 Claims, 2 Drawing Sheets

SEMICONDUCTOR COMPONENT

CROSS-REFERENCE TO RELATED APPLICATION

This application is a continuation of copending International Application No. PCT/EP01/05216, filed May 8, 2001, which designated the United States and was not published in English.

BACKGROUND OF THE INVENTION

Field of the Invention

The invention relates to a semiconductor component having at least two semiconductor bodies that are spatially separate from one another and electrically connected to one another.

By way of example, in switched-mode power supplies and, in particular, in power factor controllers, in asymmetrical half-bridges, in drive converters for switched reluctance motors, a semiconductor power switch such as, for example, a MOS field-effect transistor, an IGBT or a bipolar transistor is connected up in series with, for example, a PN diode or a Schottky diode in such a way that the drain contact of the switch is at the same potential as the anode contact of the diode. Semiconductor components required for this are intended to be cost-effective and compact and also have low parasitic inductances.

In this case, it is customary to construct the circuit with discrete components or using surface mounted device (SMD) technology on a circuit board or to populate a DCB substrate with solderable semiconductor chips. An insulating substrate is also used in devices with a housing encapsulated by molding (for example TO-220, TO-247 or the like). In addition, split base plates (lead frames) with mutually insulated metal islands are also used. What is often problematic in this case is the severe evolution of heat in the individual semiconductor bodies, so that a compact construction is not possible.

SUMMARY OF THE INVENTION

It is accordingly an object of the invention to provide a semiconductor component that overcomes the above-mentioned disadvantages of the prior art and devices of this general type, which has at least two semiconductor bodies that are spatially separate from one another and electrically connected to one another.

With the foregoing and other objects in view there is provided, in accordance with the invention, a semiconductor component. The semiconductor component has a common housing and at least two semiconductor bodies disposed spatially separate from one another and electrically connected to one another in the common housing. The two semiconductor bodies include a first semiconductor body being a compensation MOS field-effect transistor for at least one of relatively high voltages and powers and a second semiconductor body being a silicon carbide Schottky diode.

The semiconductor component according to the invention has at least two semiconductor bodies that are spatially separate from one another and electrically connected to one another in a common housing. A compensation MOS field-effect transistor for relatively high voltages and/or powers (such as, for example, a CoolMOS transistor) is provided as the first semiconductor body and a silicon carbide Schottky diode is provided as the second semiconductor body.

Consequently, semiconductor components according to the invention can advantageously be produced significantly more compactly and more cost-effectively, since both the compensation MOS field-effect transistor and the silicon carbide Schottky diode contribute to a significant reduction of power loss.

Preferably, the two semiconductor bodies are constructed and connected up to one another in such a way that together they form a power switch.

In one development of the invention, a third semiconductor body is additionally provided, which is electrically connected at least to one of the other two semiconductor bodies, and the three semiconductor bodies are connected up to one another in a manner forming a step-down converter or a step-up converter function. The third semiconductor body can be mounted just like integrated circuits generally by known soldering or adhesive bonding processes on the base plate or chip-on-chip on one of the other two semiconductor bodies.

In another development of the invention, the semiconductor component has, in addition to two semiconductor bodies that are spatially separate from one another and electrically connected to one another, a base plate, to which the first semiconductor body is fixed, and an elevation disposed on the base plate, to which elevation the second semiconductor body is fixed. The edge termination which lies in a planar manner on or near to the top side and is optimized for the reverse voltage to be blocked inherently prevents an upside down construction, since either with or without a dielectric passivation layer on the top side of the component, the equipotential area of the conductive base plate adversely influences the field distribution in or above the edge termination. This effect does not occur, however, as a result of the height offset of the two semiconductor bodies.

A higher degree of compactness can be obtained by virtue of the fact that the elevation has a base area that is less than the base area of the second semiconductor body fixed to it. Consequently, by way of example, the first semiconductor body can be disposed at least partly below the second semiconductor body.

In order to facilitate contact-making, the elevation has an electrically conductive contact-making area in the region of the second semiconductor body. Correspondingly, the second semiconductor body has an electrically conductive contact-making area in the region of the elevation. For mounting and contact-making of the second semiconductor body, the contact-making areas of the elevation and the second semiconductor body are then soldered to one another or electrically conductively adhesively bonded to one another.

Further contact-making is preferably effected on a further contact-making area disposed at a side of the second semiconductor body that is remote from the elevation. For further contact-making, a bonding connection is advantageously provided.

The second semiconductor body may have a passivation layer on the side facing the elevation. In the case of uncovering the contact window, that is to say the opening for the contact-making area, the passivation layer may be configured in such a way that the second semiconductor body is reliably aligned on the elevation before the soldering (or adhesive bonding) of the contact-making area.

Preferably, both the base plate and the elevation are produced from metal, in order to be able to produce a conductive connection between the two semiconductor bodies in a simple manner. In the case of a base plate produced from metal, the elevation can be realized by virtue of the fact that the elevation is formed by embossing during the stamping of the base plate. Thus, both the base plate and the elevation can be produced in one work operation.

The elevation preferably has a height relative to the base plate that amounts to a multiple of the width of the edge termination of the second semiconductor body. This results in reliable insulation of the two semiconductor bodies. For a semiconductor component configured for 600 V, the height is greater than 1 mm, for example.

The silicon carbide diode used according to the invention preferably has a solderable or conductive-adhesive-bondable anode contact metallization and a bondable cathode metallization, that is to say exactly interchanged relative to the metallizations that are customary nowadays. A particular advantage in the case of such a configuration is that the thermal resistance is significantly improved by the upside down construction, since the location where the maximum power loss occurs is the PN or metal/semiconductor junction and the latter, in the case of the construction according to the invention, lies nearer to the power loss sink at the, for example, soldered junction between second semiconductor body and base plate.

In particular, the diodes whose cathode is connected to an active potential and whose anode is connected to a quiescent potential are suitable, the base plate being connected to the respective anodes. Diodes of this type are optimized with regard to their electromagnetic compatibility. Furthermore, in the case of diodes of this type, a considerable reduction of the interference currents can be achieved by a cooling lug at anode potential especially in the case of step-down converters.

In all applications of the semiconductor components according to the invention, incorporation of an additional insulating layer is not necessary, nor do any insulation problems arise for the user in the case of the direct mounting of the device on a heat sink, as is the case with the use of, for example, a split base plate (lead frame).

Other features which are considered as characteristic for the invention are set forth in the appended claims.

Although the invention is illustrated and described herein as embodied in a semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
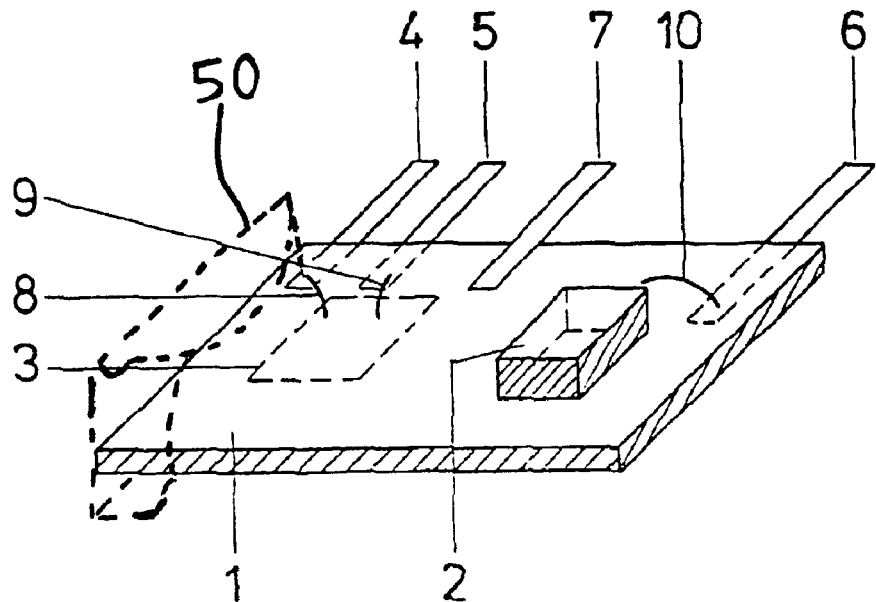
FIG. 1 is a diagrammatic, perspective view of a base plate in the case of a semiconductor component according to the invention.

Referring now to the figures of the drawing in detail and first, particularly, to FIG. 1 thereof, there is shown a semiconductor component according to the invention with a base plate 1, on which an elevation 2 is formed by embossing, for example. An injection-molded encapsulated housing 50 is shown diagrammatically by dashed lines and heavily cut-away for the sake of better clarity. In the exemplary embodiment, the elevation 2 is rectangular, but it may also have, in the same way, other forms, for example round or oval forms. A first semiconductor body 3, for example a MOS field-effect transistor 3 (such as, for instance, a Cool-MOS transistor) for relatively high voltages and relatively high powers, is soldered on the base plate 1 in addition to the elevation 2, thereby producing an electrical contact between the MOS field-effect transistor and a terminal of the MOS field-effect transistor 3. The other two terminals of the MOS field-effect transistor 3 are connected to a respective terminal contact 4 and 5 by bonds. The terminal contacts 4 and 5 are fixed to the base plate 1 in a manner electrically insulated from the latter, just like terminal contact 6. Finally, terminal contact 7 is electrically conductively connected to the base plate 1 and fixed thereto.

Figure 2:
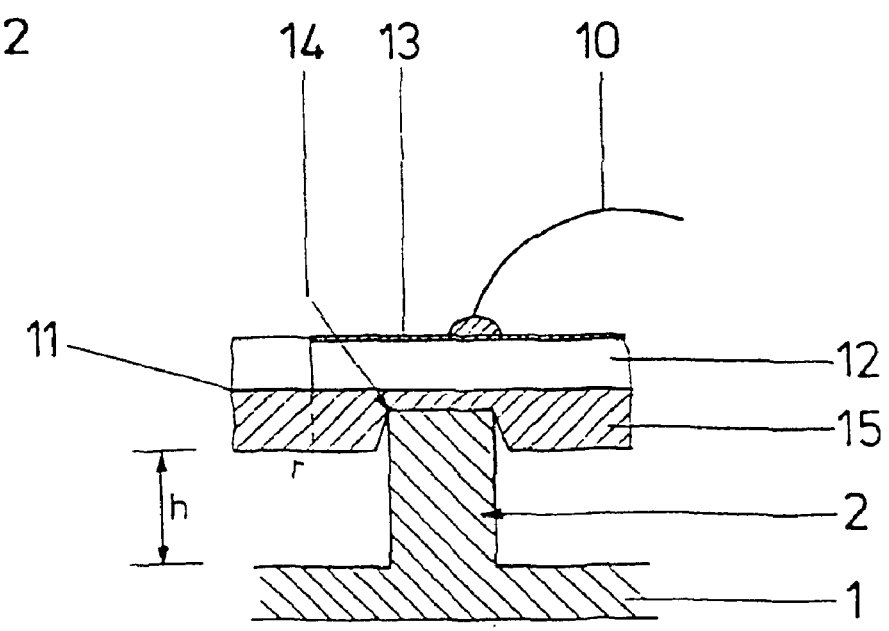
FIG. 2 is a sectional view of a mounting of a semiconductor body on an elevation of the base plate in the case of a semiconductor component according to the invention.

The contacts of the MOS field-effect transistor 3 that are not directly connected to the base plate 1 are electrically connected to the terminal contacts 4 and 5 by bonding wires 8 and 9. In this case, the terminal contact 6 is also provided for bonding to a second semiconductor body (not illustrated in FIG. 1) which is applied to the elevation 2. In this case, a bonding wire 10 passes from the terminal contact 6 to the top side of the second semiconductor body which is illustrated in more detail in FIG. 2.

A diode 11 is provided as the second semiconductor body 11, which diode 11 has, in addition to the actual semiconductor structure 12, a bondable contact-making area 13 at the top side thereof and also a solderable contact-making area 14 on a side facing the elevation 2. In this case, the contact-making area 14 is soldered to the elevation 2 on the one hand for the purpose of electrical connection and on the other hand for the purpose of mechanical fixing to the elevation 2. A passivation layer 15 (for example 40 $\mu$m polyimide) is situated around the solderable contact-making area 14 and has a cutout in the region of the solderable contact-making area 14, in such a configuration that a contact window is produced which reliably aligns the diode 11 on the elevation 2 prior to soldering.

In this case, a height h of the elevation 2 is dimensioned such that it amounts to a multiple of a width of the edge termination r (not shown true to scale in the drawing). In this case, the height h is dimensioned as the distance between the underside of the passivation layer 15 and the top side of the metal base plate 1.

Figure 3:
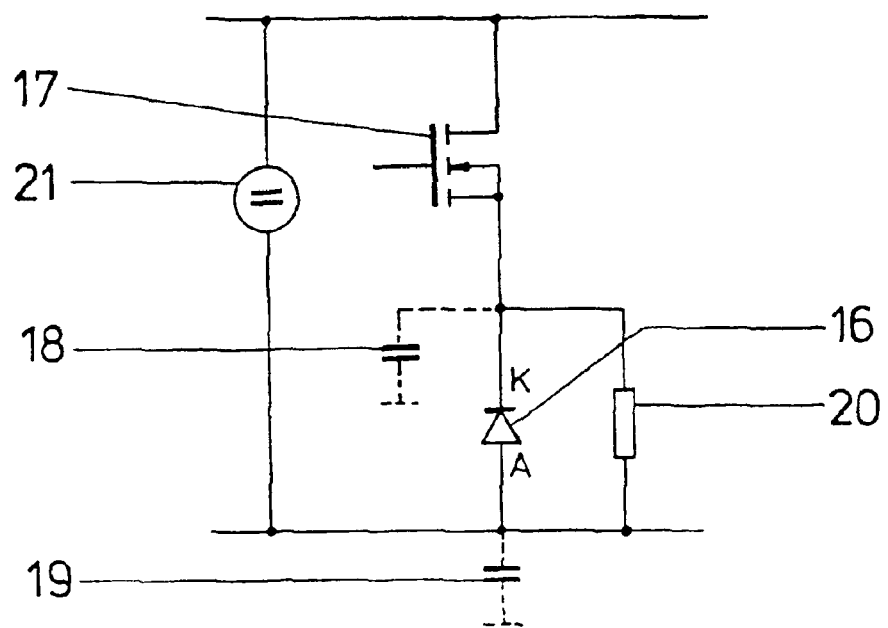
FIG. 3 is a circuit diagram of an application of the semiconductor component according to the invention in the case of a power switch.

An exemplary application for a semiconductor component according to the invention is illustrated in FIG. 3, where the second semiconductor body is formed as a diode 16 being a silicon carbide diode, with a cathode K as a first terminal and an anode A as a second terminal. The diode 1 is connected in series with the controlled path of a MOS field-effect transistor 17 and serves as a freewheeling diode in the exemplary embodiment. In this case, a load 20 is connected in parallel with the diode 16, the series circuit containing the diode 16 and the transistor 17 being fed by a high-voltage voltage source 21. When the anode A is connected to the base plate (lead frame) and the cathode K lies on the top side, the anode A is at a quiescent potential. Thus, an interference current is no longer coupled into the ground circuit via the relatively large capacitance 18. Only a very much smaller capacitance 19 of the cathode K relative to the base plate serving as heat sink is at a time-variable potential. However, since the capacitance 19 of the cathode K is very small, coupling of interference currents into the ground circuit is reliably suppressed.

Figure 4:
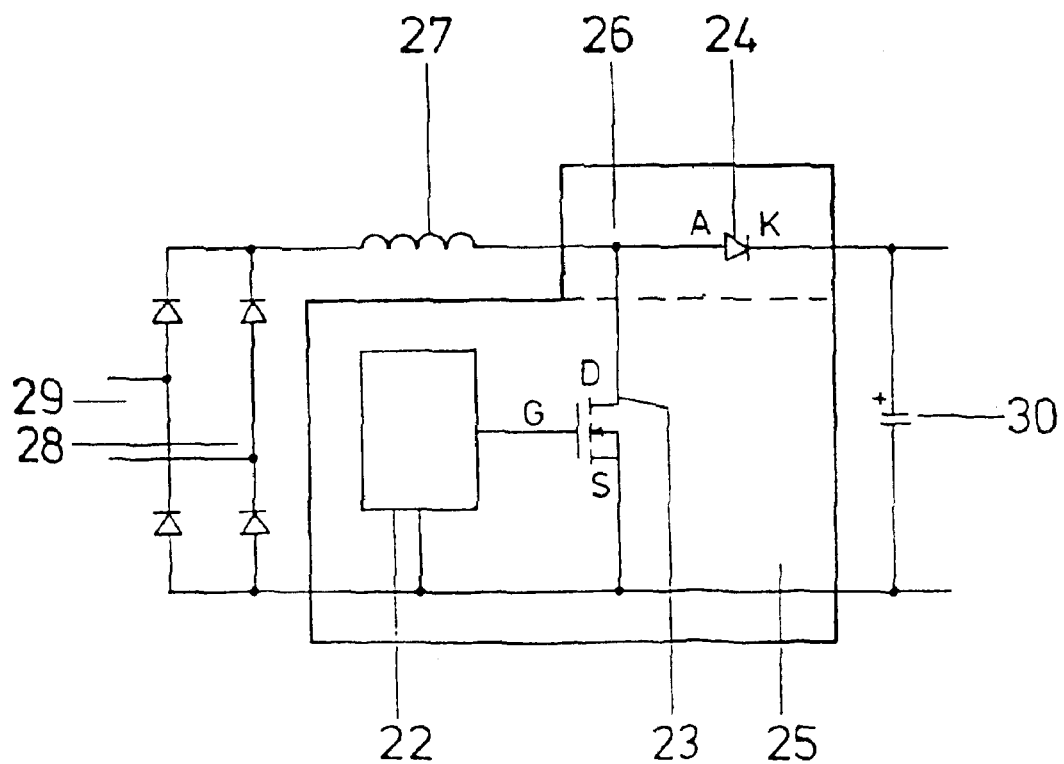
FIG. 4 is a circuit diagram of an application of the semiconductor component according to the invention in the case of a configuration for active power factor correction.

In another exemplary embodiment, shown in FIG. 4, three semiconductor bodies are combined in a single semiconductor component according to the invention. In this case, an integrated circuit 22, a compensation MOS field-effect transistor for high powers and voltages (CoolMOS) 23 and also a silicon carbide Schottky diode 24 are combined to form a single semiconductor component. In this case, the integrated circuit 22 and the compensation MOS field-effect transistor 23 are applied to a base plate 25 having an elevation 26 (in accordance with the configurations in FIG. 1 and FIG. 2), on which the silicon carbide diode 24 (in accordance with FIG. 2) is mounted. However, the integrated circuit 22 can also be provided on the switch 23 using chip-on-chip mounting.

Internally, the integrated circuit 22, the compensation MOS field-effect transistor 23 and the silicon carbide diode 24 are connected up to one another in such a way that the integrated circuit 22 drives a gate G of the compensation MOS field-effect transistor 23, whose source S is connected to one terminal of a voltage source and whose drain D is connected, with interposition of an inductor 27, to the other terminal of a voltage source. In this case, the voltage source is formed from a bridge rectifier 28 fed with an AC voltage 29. The drain terminal of the compensation MOS field-effect transistor 23 is additionally connected to the anode A of the silicon carbide diode 24, whose cathode K is coupled to one pole of the supply voltage source via a smoothing capacitor 30. In this case, the anode of the silicon carbide diode 24 is connected to the drain terminal of the compensation MOS field-effect transistor 23 via the base plate 25 in conjunction with the elevation 26. Overall, the exemplary embodiment exhibits a configuration for power factor correction.

Specifically, IEC/EN 61 000-3-2 defines the limit values for the harmonics content for the input current for loads with an input power of more than 75 W. This applies to all devices that are supplied by the public power supply system. In devices with a diode rectifier and downstream intermediate circuit capacitor, a poor power factor results (around 0.6). The input current is severely non-sinusoidal (distorted in pulsed fashion). Accordingly, power factor correction is necessary.

Although a purely passive solution with a large input inductor achieves a slightly improved input current profile with a power factor of about 0.75, the requirements with regard to the harmonics content are complied with only to a limited extent.

Better results are made possible by active power factor correction on the basis of a step-up converter as is shown for example in FIG. 4. A power factor of above 0.98 can be achieved with this configuration. In the realization of a configuration for active power factor correction, generally three semiconductor components are required: a power switch (for example the power MOS field-effect transistor or IGBT), the power diode and an integrated control unit. Hitherto, these three semiconductor components have usually been constructed in discrete form on a circuit board, and each semiconductor component had its own housing. As a result, the space requirement was considerable.

The configuration for power factor correction as shown in FIG. 4 uses a semiconductor component according to the invention with a silicon carbide Schottky diode and a compensation MOS field-effect transistor for high powers and voltages (CoolMOS) on the basis of a step-up converter topology. However, the individual elements are combined in a single housing with suitable heat loss dissipation such as, for example, TO-220 (also Fullpack) or TO-247.

Through the interaction of various measures, it is possible to achieve a housing size reduction even for very high powers and/or very high voltages.

Thus, by way of example, a lower power loss is achieved by using a silicon carbide Schottky diode for high voltages. The heat arising as a result of the lower power loss thereof can be dissipated more easily. Furthermore, the use of a compensation MOS field-effect transistor for high voltages and powers affords a smaller space requirement, since this type of transistor requires a much smaller chip area compared with other power transistors. As a result, it is possible for the integrated circuit provided for control also to be concomitantly integrated into the common housing. Furthermore, a compensation MOS field-effect transistor has smaller capacitances, which in turn leads to smaller switching losses and, as a result, likewise reduces the heat loss that arises.

Finally, by optimally coordinating the individual components with one another, it is possible to reduce the overall system costs, reduce the volume, reduce the weight, reduce the power loss (smaller heat sinks required), reduce the mounting outlay and to increase the efficiency.

We claim:

1. A semiconductor component, comprising:
   a common housing;
   at least two semiconductor bodies disposed spatially separate from one another and electrically connected to one another in said common housing, said two semiconductor bodies including a first semiconductor body being a compensation MOS field-effect transistor for at least one of relatively high voltages and powers and a second semiconductor body being a silicon carbide Schottky diode;
   a base plate, said first semiconductor body being fixed to said base plate; and
   an elevation disposed on said base plate, said second semiconductor body being fixed to said elevation.

2. The semiconductor component according to claim 1, wherein said two semiconductor bodies are constructed and connected up to one another in a manner forming a power switch.

3. The semiconductor component according to claim 1, further comprising a third semiconductor body electrically connected to at least one of said two semiconductor bodies, said first, second and third semiconductor bodies are connected up to one another in a manner forming one of a step-down converter and a step-up converter function.

4. The semiconductor component according to claim 3, wherein said third semiconductor body is fixed to one of said first and second semiconductor bodies.

5. The semiconductor component according to claim 1, wherein said elevation has a base area which is less than a base area of said second semiconductor body fixed to said base area of said elevation.

6. The semiconductor component according to claim 1, wherein:
   said elevation has an electrically conductive contact-making area in a region of said second semiconductor body;
   said second semiconductor body has an electrically conductive contact-making area in a region of said elevation; and
   said contact-making area of said elevation and said contact-making area of said second semiconductor body are one of soldered and electrically conductively adhesively bonded to one another.

7. The semiconductor component according to claim 6, wherein said second semiconductor body has a further contact-making area on a side remote from said elevation, a bonding connection being provided on said further contact-making area.

8. The semiconductor component according to claim 1, wherein said second semiconductor body has a passivation layer with a contact window formed on a side facing said elevation, said contact window aligning said second semiconductor body on said elevation.

9. The semiconductor component according to claim 1, wherein said elevation and said base plate are produced from metal, and said elevation is realized by embossing during a stamping of said base plate.

10. The semiconductor component according to claim 1, wherein said second semiconductor body has an edge termination with a given width, said elevation has a height relative to said base plate amounting to a multiple of said given width of said edge termination of said second semiconductor body.

11. The semiconductor component according to claim 1, wherein said second semiconductor body has a solderable anode contact metallization and a bondable cathode contact metallization.

12. The semiconductor component according to claim 1, wherein said third semiconductor body is fixed to said base plate.

13. The semiconductor component according to claim 1, wherein said silicon carbide Schottky diode is one of a diode element and a diode having a cathode connected to an active potential and an anode connected to a quiescent potential, said base plate connected to said anode.

* * * * *